United States Patent [19]
Miyake et al.

[11] Patent Number: 5,473,577
[45] Date of Patent: Dec. 5, 1995

[54] SERIAL MEMORY

[75] Inventors: Jun Miyake, Woburn, Mass.; Jun Kitano, Kodaira, Japan

[73] Assignee: Hitachi, Ltd., Tokyo, Japan

[21] Appl. No.: 215,758

[22] Filed: Mar. 21, 1994

[30] Foreign Application Priority Data

Mar. 20, 1993 [JP] Japan .................................. 5-085327

[51] Int. Cl.⁶ .................................................. G11C 13/00
[52] U.S. Cl. ................................. 365/238; 365/189.04
[58] Field of Search .................................. 365/238, 235, 365/222, 189.04, 189.05

[56] References Cited

U.S. PATENT DOCUMENTS 3,763,480  10/1973  Weimer .................................. 365/238

Primary Examiner—Terrell W. Fears
Attorney, Agent, or Firm—Antonelli, Terry, Stout & Kraus

[57] ABSTRACT

In a serial memory which internally converts serial input data into parallel data and writes the data into a memory array two or more bits at a time, and which reads data two or more bits at a time from the memory array and internally converts the read data into serial data for output, circuits are provided that allow selective reversing of the order of parallel conversion on the serial input data and of serial conversion on the parallel data read from the memory array. This serial memory is also provided with a memory controller to reverse the ascending or descending order of the access address for the memory array in the read and write operations.

10 Claims, 12 Drawing Sheets

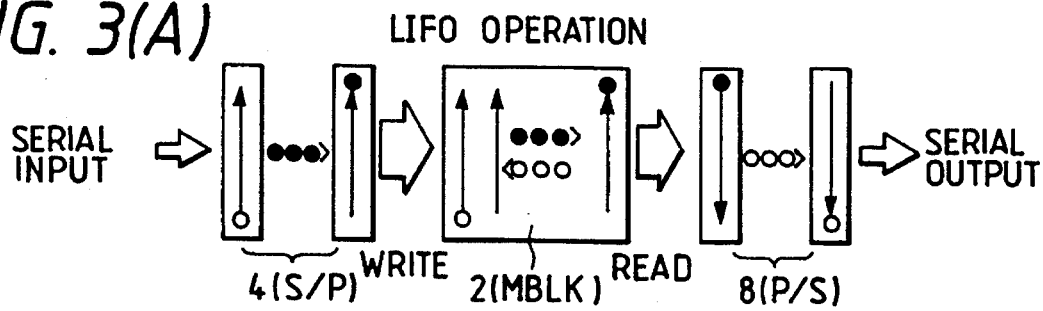
FIG. 3(A) LIFO OPERATION
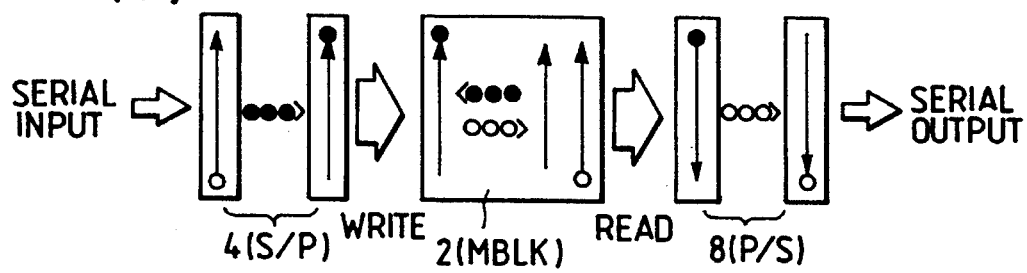
FIG. 3(B)
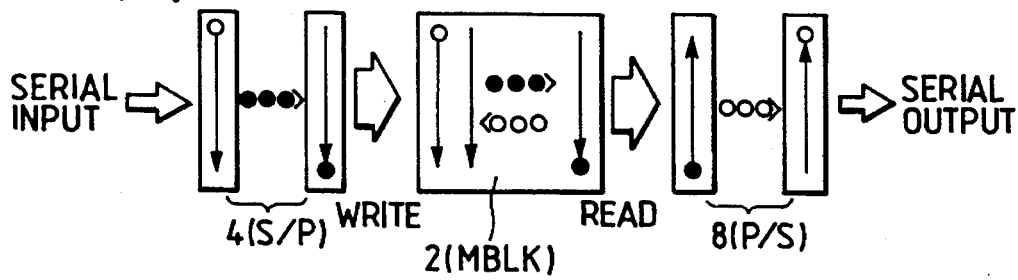
FIG. 3(C)
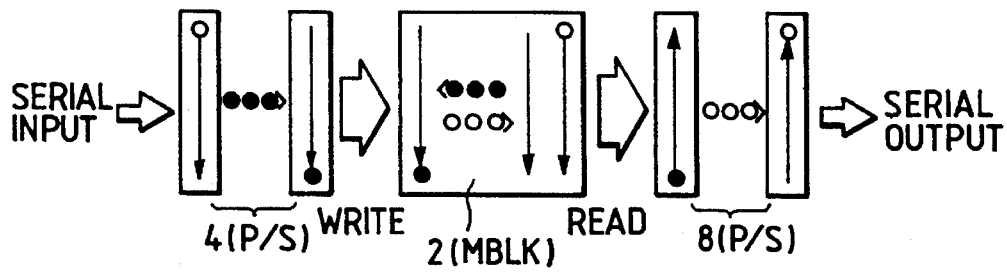
FIG. 3(D)
○ START OF INPUT DATA  ● END OF INPUT DATA  ●●● ORDER OF WRITE  ○○○ ORDER OF READ

FIG. 6 (BLOCK DIAGRAM FOR ADDRESS CONTROLLER AND ASSOCIATED CIRCUITS)

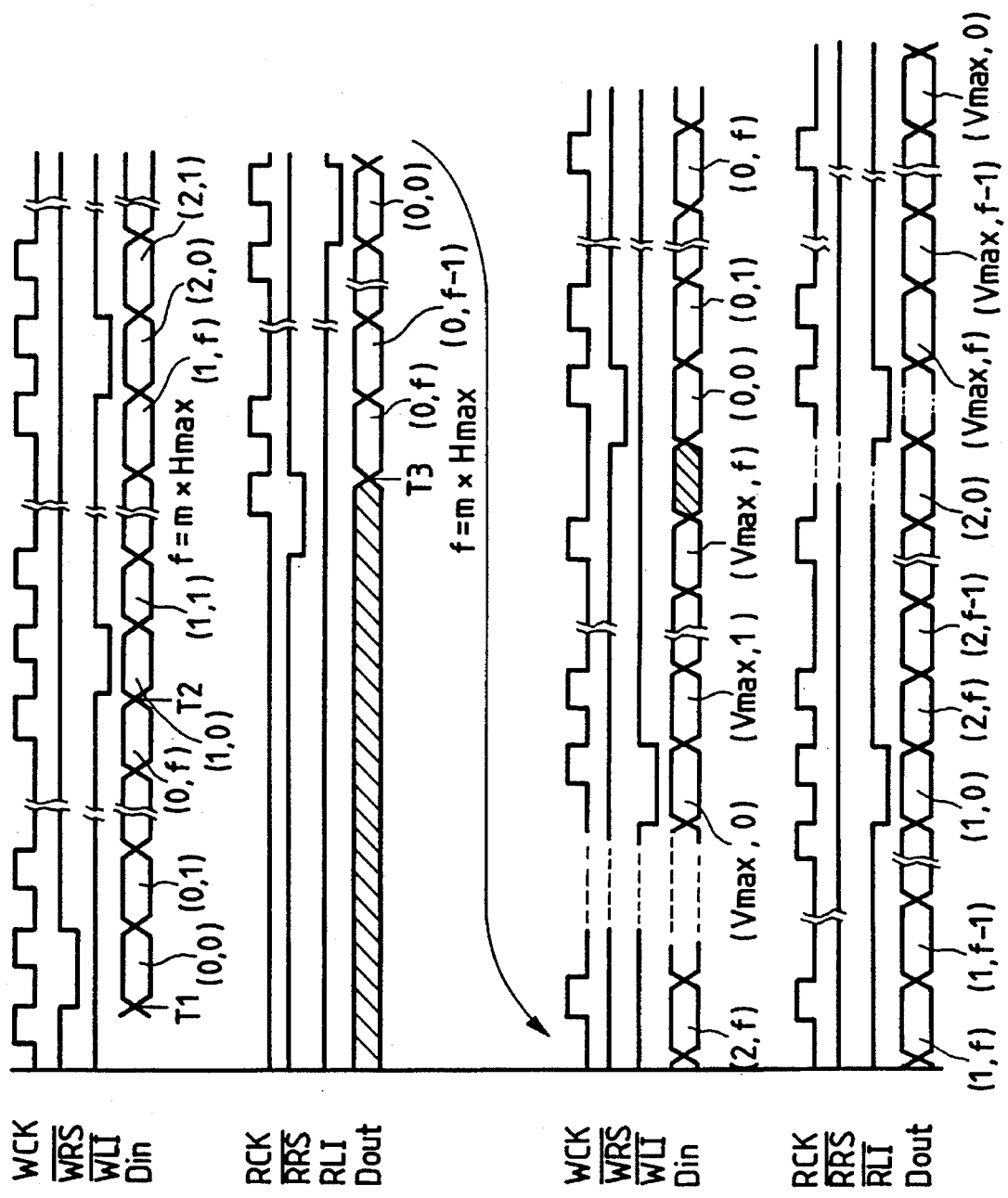
FIG. 10 OPERATION TIMING FOR REVERSE SCAN ONLY IN HORIZONTAL DIRECTION

000
SERIAL MEMORY

BACKGROUND OF THE INVENTION

The present invention relates to a serial memory which has, for example, a function of serial input/output of data for image systems and more specifically to a technique suitably applied to image processing systems and other systems that process print data in a bit map format.

There is generally known a serial memory, which internally converts serial input data into parallel data and writes the data into a memory array two or more bits at a time, and which internally converts data that was read two or more bits at a time from the memory array into serial data and puts out the converted data in the same order that the data was input. A prior application filed by this inventor (Japanese Patent Application No. 108503/1991) discloses a two-dimensional compatible serial memory, which incorporates a line increment function that allows quick access from an arbitrary point to the beginning of the next line, and which further includes a window scan mode whereby a horizontal address (a resetting destination during the execution of the line increment) can be set and fixed from "0" during the normal mode to any arbitrary address, making it possible to scan a rectangular area cut out from any part of the screen. In a separate application filed by this inventor (Japanese Patent Application No. 181738/1992), another type of serial memory, though not generally known, is disclosed which has a jump function that allows a serial access to start from an arbitrary address and a line increment function that permits quick access from any point on the two-dimensional screen to the beginning of the next line.

There are no large-capacity serial memories available, however, which provide a practical means for outputting the entire or any part of input data in an order reverse to that in which the data was input, and which realize this output mode by means of a mode switching or selection. Nor are there any examples of application of such memories to systems. Under these situations, when a need arises to reverse the order of scanning in image processing systems, it is necessary either to add a line memory having a last-in-first-out (LIFO) function to the system to reverse the order in which parts of serial memory data are output, or to operate the hardware of the system in reverse order.

SUMMARY OF THE INVENTION

The inventor of this invention has conducted research in an effort to enable the serial memories of the above-mentioned prior applications to output data in an order reverse to the input order virtually without modifying the existing configuration and circuits. This study has found the following:

(1) For the above-mentioned serial memory that can store one screenful of data and output the entire screen of data in an order reverse to the input order and to realize this with a dynamic picture, it is required that, while the data is being read out in the reverse order, the writing of next data be performed simultaneously. That is, a continuous LIFO must be realized.

(2) To realize a mirror inversion of the screen (left-right inversion), a control must be performed to reverse the input/output order only in the horizontal direction in the two-dimensional-compatible serial memory.

(3) In practice, the entire address space of the serial memory is rarely fully utilized from end to end to store the effective data of the screen. Thus, in an ordinary case, the input data will end at an intermediate address in the address space. In such a case, if it is not possible to read the input data backward from the last address at which the writing was terminated, this gives rise to an application problem.

An object of this invention is to provide a serial memory which can serially output the entire or any part of input data in an order reverse to the input order almost without changing the basic configuration of the serial memory.

Another object of this invention is to provide a serial memory that can realize a continuous LIFO function.

A further object of this invention is to provide a two-dimensional-address-compatible serial memory which can reverse the input/output order only in the horizontal direction.

These and other objects and novel features of this invention will become apparent from the following description in this specification and the accompanying drawings.

Representative aspects of this invention disclosed in this specification are briefly summarized below.

The serial memory of this invention employs a serial-parallel conversion means which is capable of selectively reversing the conversion order when internally converting the serial input data to parallel data. The process of converting data read parallelly from the memory array to serial data also adopts a parallel-serial conversion means that can selectively reverse the conversion order.

A memory control means employs a selection circuit, which permits the writing of serial-parallel converted data into a memory array in an address-decrementing order, reverse to an address-incrementing order, and which also allows the reading of data from the memory array in the address-decrementing order. When the memory array has a two-dimensional address space defined in horizontal and vertical directions, this selection circuit enables such writing or reading operations for each direction.

The serial output performed in the order reverse to the serial input is realized by combining the control switching for the serial conversion or parallel conversion with the control switching for the writing of data into the memory array or the reading of data from the memory array.

With the above means, the data is written into the memory array two or more bits at a time. As to the order in which data is written into or read out from the memory array two or more bits at a time, the fact that the order is reversed from the normal order, either when performing parallel conversion of write data or when doing serial conversion of read data, acts to reverse the order of the output data with respect to the order of the input data during the serial-parallel or parallel-serial conversion. Further, as for the order in which data of two or more bits is transferred, the fact that the addresses are made accessible in a decrementing order reverse to the normal incrementing order when writing into or reading from the memory array acts to reverse the order of access addresses during output with respect to that during input. These actions combine to realize a LIFO operation and also a continuous LIFO operation. Concerning the continuous LIFO operation, the operations shown in FIG. 3(A) and 3(B) are similar except that they have opposite directions in which read and write operations on the memory block 2 are performed. Thus, in the operation of FIG. 3(A), if the next input data is written into the memory block 2 while the first data already written into the memory block 2 is being successively read out, this write operation corresponds to FIG. 3(B). In the LIFO also, this operation allows the next data to be written simultaneously with the reading of the first data, thus realizing a continuous LIFO operation. In the operations shown in FIGS. 3(C) and 3(D), too, similar continuous LIFO operations can be realized.

BRIEF DESCRIPTION OF THE DRAWINGS

FIGS. 3(A) to 3(D) are conceptual diagrams showing the LIFO operation in the serial memory of this embodiment;

FIG. 10 is an operation timing chart when a reverse scan is performed only in the horizontal direction.

BRIEF DESCRIPTION OF THE PREFERRED EMBODIMENTS

Basic Configuration of Serial Memory

Figure 1:
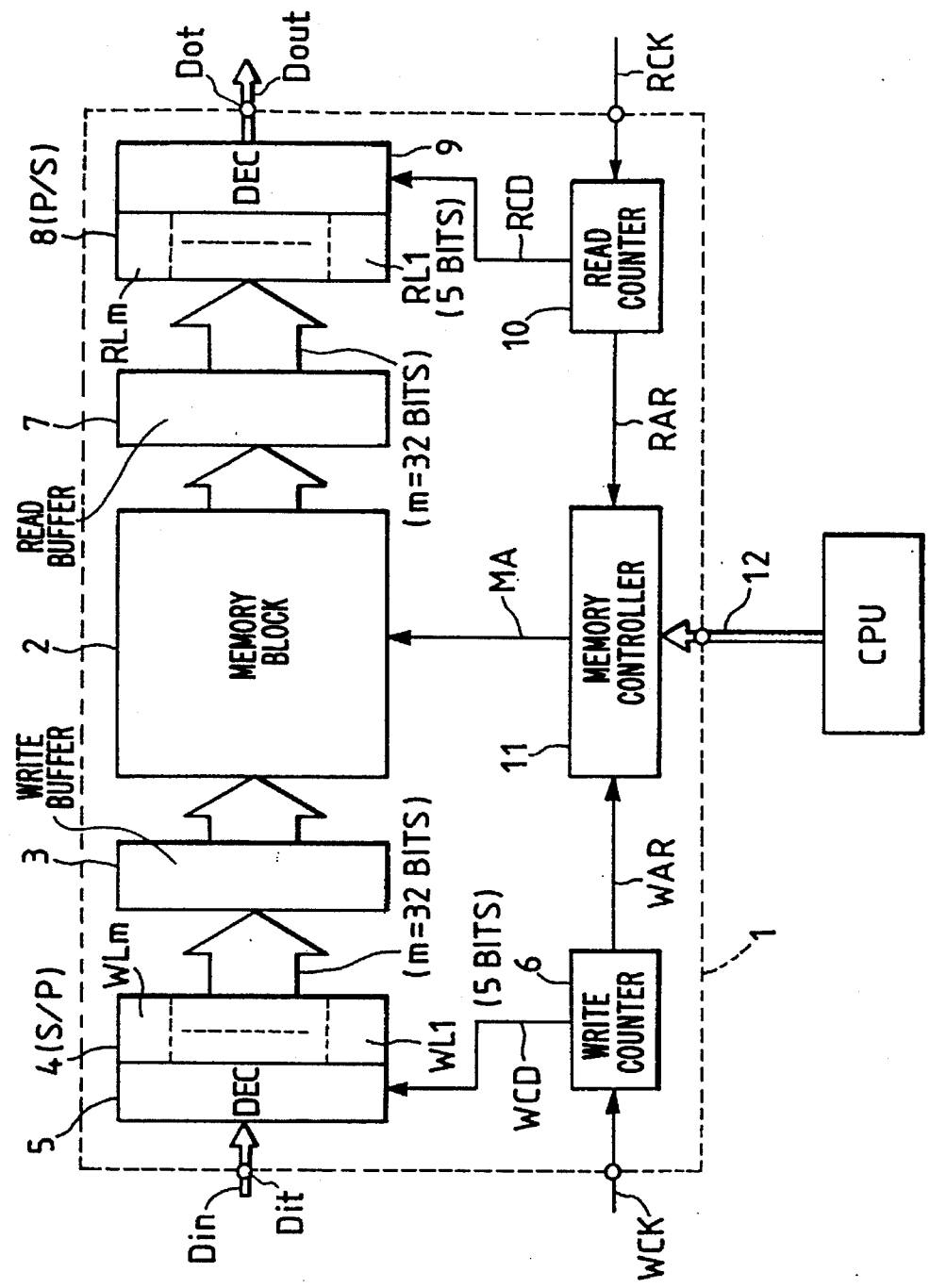
FIG. 1 is a block diagram of a serial memory forming one embodiment of this invention.

FIG. 1 shows a block diagram of a serial memory as one embodiment of this invention. A serial memory 1 shown in the figure includes a memory block (MBLK) 2, a write buffer (WB) 3, a serial-parallel conversion circuit (S/P) 4, a decoder (DEC) 5, a write counter (WCT) 6, a read buffer 7, a parallel-serial conversion circuit (P/S) 8, a decoder (DEC) 9, a read counter (RCT) 10 and a memory controller (MCONT) 11, and is formed in a single semiconductor substrate such as a monocrystal silicon substrate produced by a known semiconductor integrated circuit manufacturing technique.

Data Din serially input to the serial memory 1 through a data input terminal Dit is converted into parallel data of m bits each (for example, 32 bits each) by serial-parallel conversion circuit 4 and then is stored in the write buffer 3. The m-bit data stored in the write buffer 3 is parallelly written into a specified memory cell in the memory block 2 according to a memory address MA generated by the memory controller 11. This writing of data is completed before the next m-bit data is converted by the serial-parallel conversion circuit 4 and is then output. Data to be serially output Dour is read parallelly m bits at a time from the memory cell in the memory block 2 according to the memory address MA generated by the memory controller 11 and is stored in the read buffer 7. At the same time that the m-bit data is serially output from the parallel-serial conversion circuit 8, the data stored in the read buffer 7 is transferred to the parallel-serial conversion circuit 8 where it is converted into serial data, which is then output through the data output terminal Dot to external circuits outside the serial memory 1. The operation to read data from the memory block 2 into the read buffer 7 is controlled to finish so as to be finished by the time the m-bit data is serially output from the parallel-serial conversion circuit 8.

The serial-parallel conversion circuit 4 has m bits of sequentially ordered data latches WL1-WLm, which are serially accessed by the decoder 5 to latch the serial input data Din in a specified order. The parallel-serial conversion circuit 8 has m bits of sequentially ordered data latches RL1-RAm, which are serially accessed by the decoder 9 to serially output the m-bit parallel data in a specified order.

The write counter 6 performs an incrementing operation in synchronism with the write clock WCK and outputs count data (write count data WCD) to the decoder 5. If in the above explanation m is taken to be m=32, the write count data WCD is 5 bits long and is decoded by the decoder 5, successively selecting 32 data latches WL1-WLm in the specified direction. This write counter 6 has an inversion circuit that selectively inverts the incremented count data (reversing the logic value of each bit) for output. When the count data of the write counter 6, which performs an incrementing operation, is output uninverted, the data latches of the serial-parallel conversion circuit 4 are selected in the order from WL1 to WLm. When the write count data is output inverted, the data latches are selected in the order from WLm to WL1. Similarly, the read counter 10 performs an incrementing operation in synchronism with the read clock RCK and outputs count data (read count data RCD) to the decoder 9. When, for example, m is taken to be m=32, then the read counter data RCD is 5 bits long and is decoded by the decoder 9, successively selecting 32 data latches RL1-RLm in the specified direction. Like the write counter 6, this read counter 10 has an inversion circuit that selectively inverts the incremented count data (reversing the logic value of each bit) for output. When the count data of the read counter 10, which performs an incrementing operation, is output uninverted, the data latches of the parallel-serial conversion circuit 8 are selected in the order from RL1 to RLm. When the count data is output inverted, the data latches are selected in the order from RLm to RL1.

The write counter 6 and the read counter 10 generate a write request signal WAR for writing into the memory block 2 and a read request signal RAR for reading from the memory block every m cycles of the write clock WCK and read clock RCK, respectively, and operate to send these request signals to the memory controller 11. The memory controller 11 puts the requests in a certain order (arbitration) and executes memory cycles, such as write and read operations on the memory block 2. The memory controller 11, according to a control signal 12 from the central processing unit CPU, generates a memory address MA for write and read operations and increments the memory address each time it receives the read or write request. The incremented memory address with its bits either inverted or uninverted is fed to the memory block 2. Thus, the memory address used for writing and reading data to and from the memory block 2 m bits at a time can selectively be set either in a direction from the start of the memory array to the end address (in a direction beginning with a small address toward a larger address) or in a reverse direction.

Conceptual Explanation of LIFO and FIFO Operation in the Serial Memory

FIG. 2 and FIGS. 3(A) through 3(D) are conceptual diagrams showing basic operations of the serial memory of this embodiment. In these figures, symbol ○ represents the start of the input data Din, ● the end of the input data Din, ○○○> the order of a read operation, and ●●●> the order of a write operation. The memory block 2, for example, has a one-dimensional address space, with the left side defined as the start address and the right side as the end address. The serial memory of this embodiment supports an FIFO (first-in-first-out) operation shown in FIG. 2 and four kinds of typical LIFO (last-in-first-out) operations shown in FIGS. 3(A) through 3(D). These operations can be realized by selecting either a forward-order conversion (data is latched in the order from WL1 to WLm or from RL1 to RLm in FIG. 1) or a reverse-order conversion (data is latched in the order from WLm to WL1 or from RAm to RL1 in FIG. 1) in the serial-parallel conversion circuit 4 and in the parallel-serial conversion circuit 8 and by selecting either a forward-order access (in a direction from the start address toward the end address) or a reverse-order access (in a direction from the end address toward the start address) when the memory controller 11 accesses the memory block 2.

Figure 2:
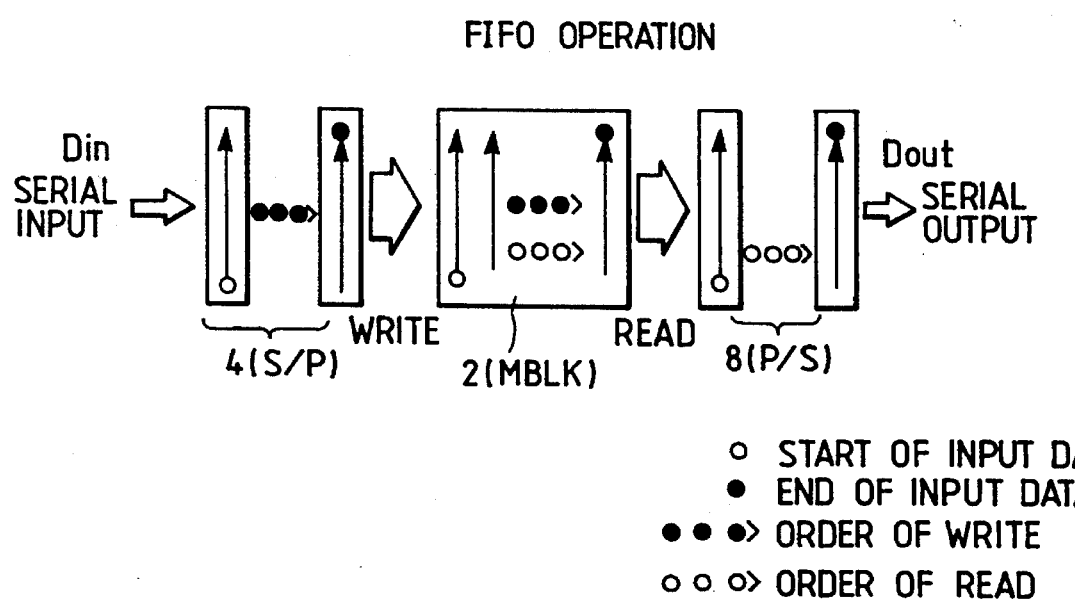
FIG. 2 is a conceptual diagram showing the FIFO operation in the serial memory of this embodiment.

The FIFO (first-in-first-out) operation shown in FIG. 2 performs the forward-order conversion (data is latched in the order from WL1 to WLm or from RL1 to RLm in FIG. 1) both in the serial-parallel conversion for the serial input and in the parallel-serial conversion for serial output and also executes the forward-order access (in the direction from the start address toward the end address) during the writing or reading of the memory block (MBLK) 2. In other words, the serial-parallel conversion circuit 4 performs the serial-parallel conversion on the input data Din in the forward direction (i.e., latching the input data in the order from WL1 to WLm). The parallel-converted data is then written into the memory block 2 by the memory controller 11 through the forward access (i.e., writing data in a direction from the start address toward the end address). In the data read operation, the memory controller 11 makes forward access to the memory block (i.e., reading data in a direction from the start address toward the end address). In other words, the memory controller 11 reads first the data that was written first. The parallel-serial conversion circuit 8 latches data-which was parallelly read out from the memory block 2 through the forward access-in the order from RL1 to RLm to convert it in the forward order into serial data as the serial output Dout.

FIGS. 3(A) through 3(D) show the concept of the LIFO (last-in-first-out) operation. In the process of internally converting the serial input data into parallel data and storing it in the write buffer (WB) 3, FIGS. 3(C) and 3(D) perform the reverse-order conversion whereas FIG. 3(A) and 3(B) perform the forward-order conversion. During the process of converting the data, which was stored in the read buffer (RB) 7 from the memory block 2, into the serial data, FIGS. 3(A) and 3(B) represent the reverse-order conversion while FIGS. 3(C) and 3(D) represent the forward-order conversion. During the process of writing data stored in the write buffer into the memory block 2, FIGS. 3(B) and 3(D) represent reverse-order access to the memory block i.e., access in the decrementing order, which is reverse to the incrementing order that begins with the start address toward the end address, whereas FIGS. 3(A) and 3(C) show access to the memory block in the forward order or incrementing order. In reading from the memory block, FIGS. 3(A) and 3(C) show reverse-order access, i.e., read access in the decrementing order reverse to the address incrementing order, whereas FIGS. 3(B) and 3(D) show read access in the forward order. These LIFO operations are determined based on the control signal 12 given to the memory controller 11 from outside.

Therefore, the bit order in each data, which is written into and read from the memory array two or more bits at a time, can be reversed from the order in which the data was input, by inverting the normal bit order during the parallel-conversion of input data or during the serial-conversion of read-out data. The data order can be reversed from the order in which the data was input, by making access in an address decrementing order, which is reverse to the ordinary incrementing order, when writing into or reading from the memory array.

Configuration for LIFO Mode Support

Figure 4:
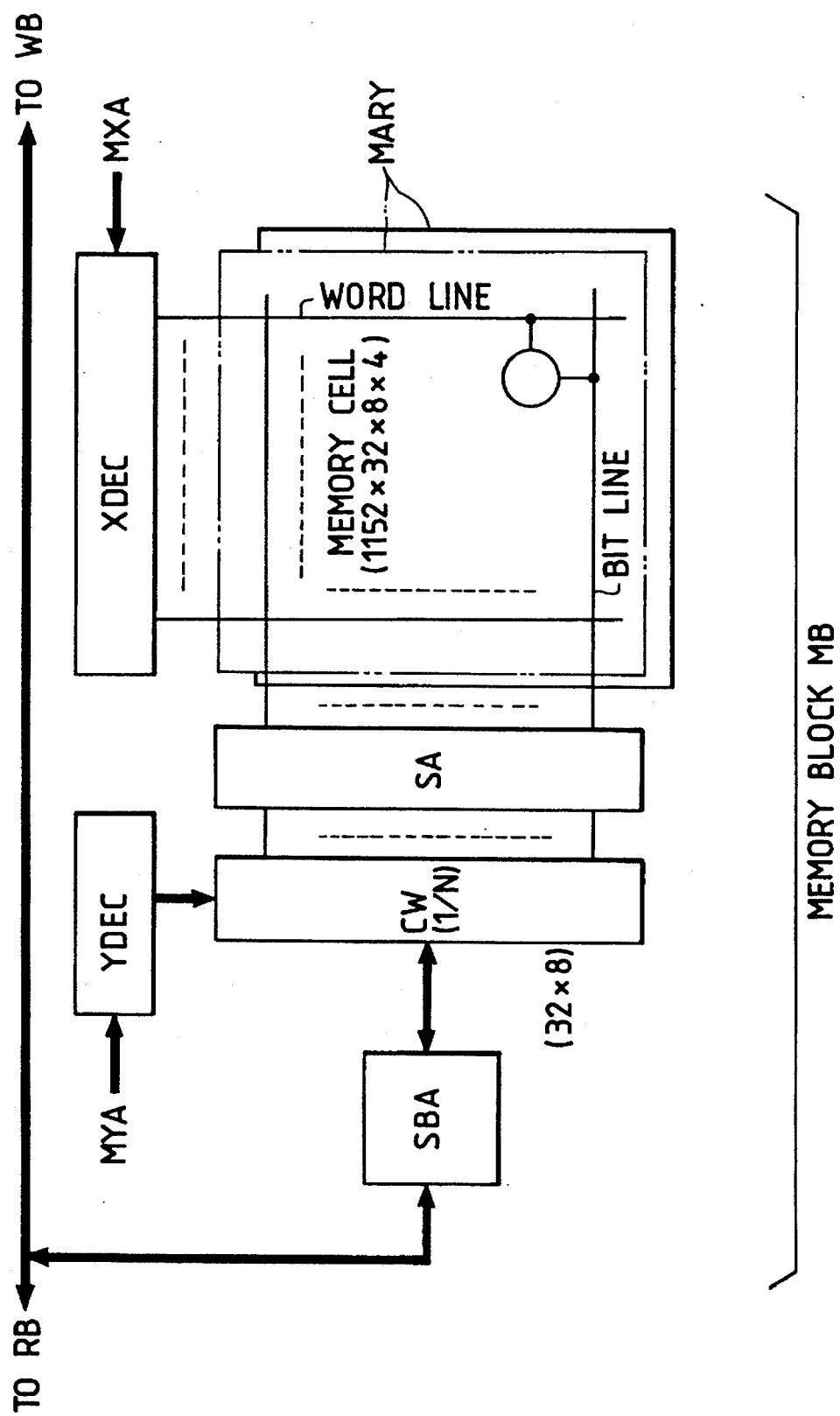
FIG. 4 is a block diagram showing the configuration of the memory block.

FIG. 4 shows an example of the configuration of the memory block MB. The memory block MB, according to this embodiment, consists basically of a memory array of a dynamic RAM (random access memory) and its address selection circuit. That is, the memory block includes: a memory array MARY similar to an ordinary dynamic RAM; a sense amplifier SA; a decoder YDEC for decoding a Y address MYA to form a bit line selection signal; a column switch CW for making a 1/N selection of the bit line according to the selection signal formed by the decoder YDEC; a sub-sense amplifier SBA for forcibly inverting the sense amplifier SA according to the write data when writing into the memory array MARY; and a decoder XDHC for decoding an X address MXA to form a word line selection signal. The 1/N selection of the bit line selects data of 32×8 bits in total. One memory array MARY is made up of 1152 word lines and 32×8×4 bit lines, and a total of two memory arrays are provided. Hence, for each memory array MARY, the column switch CW makes a ⅛ selection 4 bits at a time. Two sub-sense amplifiers SBA in all are provided like the memory array MARY. The sub-sense amplifiers SBA are connected through an internal data bus to the write buffer WB and to the read buffer RB, which are described later.

Figure 5:
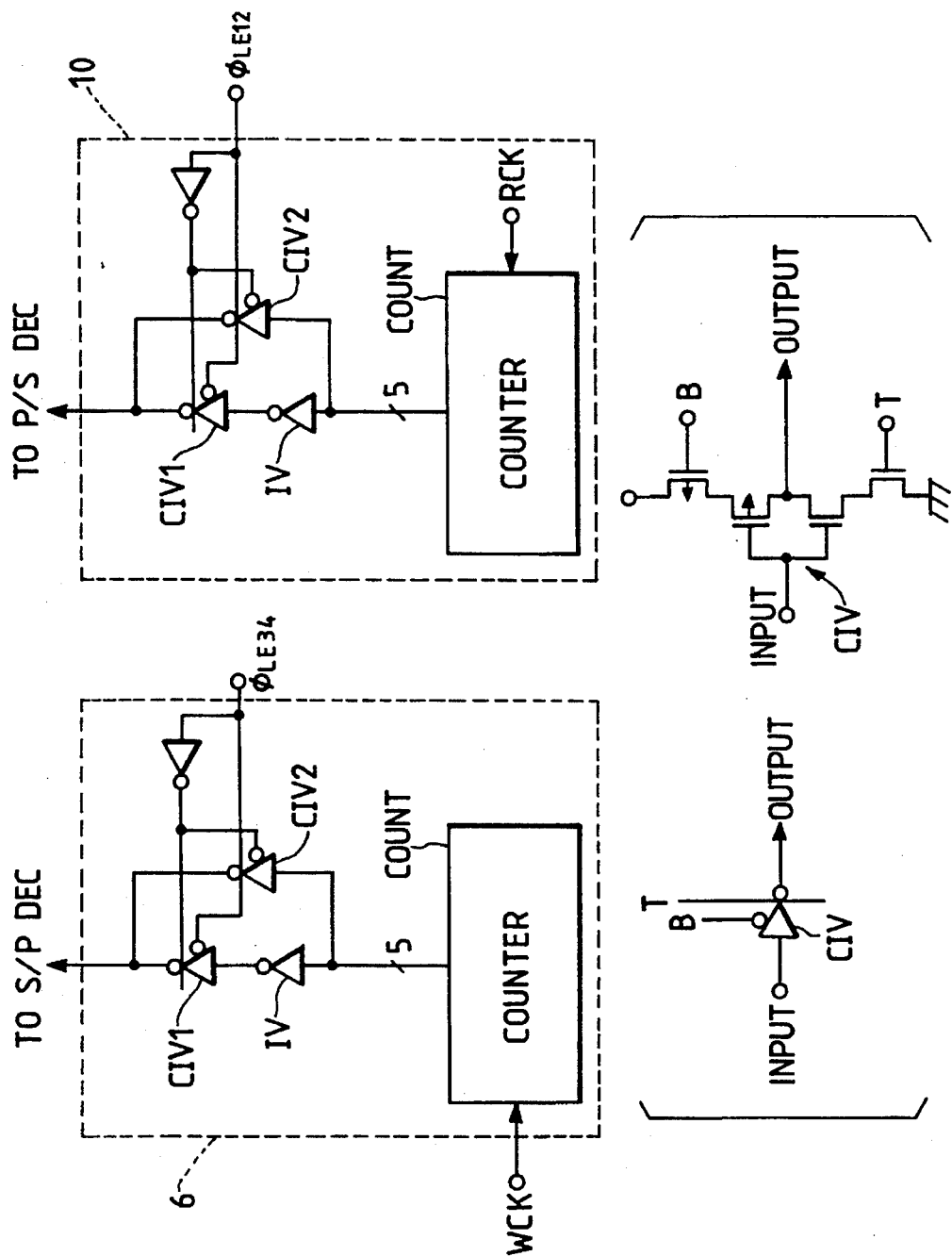
FIG. 5 is a circuit diagram showing inverted output circuits of a write counter and a read counter.

FIG. 5 shows one example of an inversion output circuit in the write counter 6 and the read counter 10. The figure represents the case of m=32, where the count value of the counter is routed either to the series path of an inverter IN and a clocked inverter CIV1 or to the path of a clocked inverter CIV2 according to a signal $\phi LE34$, $\phi LEI2$. The clocked inverters CIV1 and CIV2 can be formed of a CMCS circuit. When the order of decoding in the serial-parallel conversion circuit 4 is to be reversed from the normal one, the signal $\phi LE34$ is held high to invert the output of the counter COUNT by the clocked inverter CIV2 and the inverted counter output is fed to the decoder 5 in the serial-parallel conversion circuit 4. Likewise, when the decoding order in the parallel-serial conversion circuit 8 is to be reversed from the normal one, the signal $\phi LE12$ is held high to invert the output of the counter COUNT by the clocked inverter CIV2 and the inverted counter output is fed to the decoder 9 in the parallel-serial conversion circuit 8. In this way, the signal $\phi LE34$ is used to select between the forward serial-parallel conversion and the reverse serial-parallel conversion. Selection between the forward parallel-serial conversion and the reverse parallel-serial conversion is made by the signal $\phi LE12$.

Figure 6:
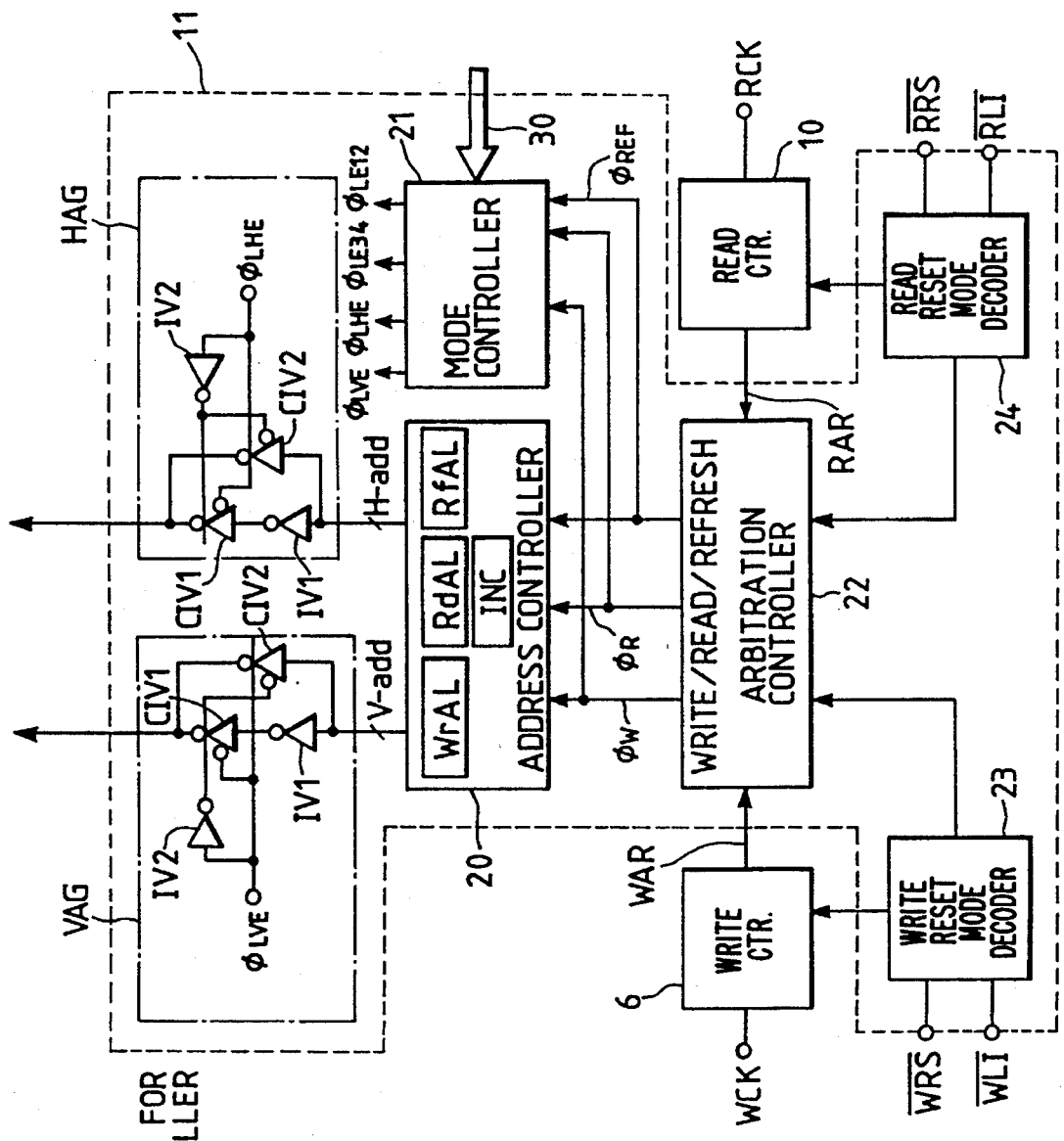
FIG. 6 is a block diagram of a memory controller.

FIG. 6 shows a block diagram of the memory controller 11 that performs the control of the above-mentioned LIFO operation. The memory controller shown in the figure includes an address controller 20, a mode controller 21, an arbitration controller 22, a write reset mode decoder 23, and a read reset mode decoder 24. In this embodiment, the address controller 20 is designed for use with a serial memory compatible with a two-dimensional screen (V, m×H), and includes a write address latch WrAL for holding a write address, a read address latch RdAL for holding a read address, a refresh address latch RfAL for holding a refresh address and an incrementer INC for taking in the output of the selected address latch and incrementing the address. The address controller 20 forms a memory address (horizontal address H-add and vertical address V-add) according to a specified procedure. In the actual circuit, the address latches WrAL, RdAL, RfAL and the incrementer INC are provided in two groups, one designed specifically for the horizontal address H-add and the other for the vertical address V-add. The arbitration controller 22 eliminates contention among read, write and refresh memory cycles by using a priority control to establish a proper memory cycle. The write request is given as the write request signal WAR from the write counter 6, and the read request is given as the read request signal RAR from the read counter 10. The refresh request is given by a refresh counter not shown. A signal φW is activated when the write operation should be carried out; a signal φR is activated when the read operation should be performed; and a signal φREF is activated when the memory cells need to be refreshed. The address controller 20 outputs an access address from the corresponding address latch according to the memory cycle selected by the arbitration controller 22.

The address generated by the address controller 20 consists of a horizontal address H-add and a vertical address V-add. Each time the write cycle, the read cycle or the refresh cycle is specified by the signal φW, φR, φREF, the horizontal address H-add of the write address, read address or refresh address is incremented. When the horizontal address H-add corresponds to the end of a line (line Hmax), the vertical address V-add is incremented and the horizontal address H-add is reset to "0."

In this embodiment, the line increment function is supported. As to the write address and the read address, when a write line increment signal WLI* (a signal attached with a symbol * represents a signal that changes from a low level to an enable level and is identical with a signal in the drawing shown with a horizontal bar over it) and a read line increment signal RLI* are enabled, the write reset mode decoder 23 and the read reset mode decoder 24 give corresponding signals to the arbitration controller 22, which in turn causes the address controller 20 to increment the vertical address V-add and to reset the horizontal address H-add to "0." At this time, the write counter 6 and the read counter 10 are reset. The write reset mode decoder 23 and the read reset mode decoder 24 reset the write counter 6 and the read counter 10 when a write reset signal WRS* and a read reset signal RRS*, both supplied from outside, are enabled.

A horizontal address generating circuit HAG and a vertical address generating circuit VAG select between the series path of an inversion output circuit inverter IN1 and a clocked inverter CIV1 and the path of a clocked inverter CIV2 according to the signal φLVE, φLHE. The horizontal address generating circuit HAG and the vertical address generating circuit VAG in the figure each have a plurality of gate circuit groups, each consisting of the inverters IN1 and IN2 and the clocked inverters CIV1 and CIV2. For simplicity, the drawing shows only one representative gate circuit group. When the vertical address V-add is to be inverted, the signal φLVE is held high to cause the vertical address V-add to be inverted by the clocked inverter CIV2 and to be output to the address decoder XDEC. When the horizontal address H-add is to be inverted, the signal φLHE is held high to cause the horizontal address H-add to be inverted by the clocked inverter CIV2 and to be output to the address decoder YDEC.

Thus, when the FIFO operation is selected, the signals φLVE and lLHE are both low, so that the addresses H-add and V-add generated by the address controller 20 are output as is to the address decoders XDEC and YDEC. When the memory array is to be addressed with only the horizontal address H-add accessed in a decrementing order, the signal φLHE is set to high level. When the memory array is to be addressed with only the vertical address V-add accessed in a decrementing order, the signal φLVE is set to high level. This causes the horizontal address H-add and the vertical address V-add to be inverted by the clocked inverter and fed to the decoders XDEC and YDEC, thus accomplishing an address access in the decrementing order. By holding both of the signals φLHE and φLVE high, it is possible to realize an access in the decrementing order, reverse to the normal mode, for the entire address space of (V×H).

The mode controller 21 receives a mode setting signal 30 of two or more bits supplied from the external central processing unit CPU and the output signals φW, φR, φREF from the arbitration controller 22, and determines the combination of levels of its output signals (indication signals) φLVE, φLHE, φLE34, φLE12 to set one of the operation modes for the serial memory shown in FIG. 2 and FIGS. 3(A) through 3(D). The mode setting signal 30 is a part of the control signal 12 in FIG. 1. The write reset signal WRS*, the write line increment signal WLI*, the read reset signal RRS* and the read line increment signal RLI* are also supplied from the central processing unit CPU as part of the control signal 12.

Which of the signals φLE12 and φLE34 in FIG. 5 is set high and which of the signals φLHE and φLVE in FIG. 6 is set high during a write operation and during a read operation are determined according to how the serial memory is used or according to the specification of a system using the serial memory. In this embodiment, setting the signal φLE12 high reverses the order of m bits in the data on the serial output side as shown in FIGS. 3(A) and 3(B). Hence, in a system that selects between the FIFO operation and the LIFO operation during the serial output, this operation mode may suitably be used. Therefore, if the serial memory is used in this operation mode only, it is possible to omit the inversion circuit on the write counter 6 side in forming the serial memory.

When the signal φLE34 is used, the order of m bits in the data on the serial input side is reversed as shown in FIGS. 3(C) and 3(D). Hence, whether the FIFO or LIFO operation is performed must be determined by the time the data is input. Therefore, if the serial memory is used in such an operation mode only, the output inversion circuit in the read counter 10 may be omitted in forming the serial memory. In this case in particular, because the serial output side requires no inversion operation, the start of the output operation can be speeded up to that extent, improving the operation efficiency of the system processing the read data.

The operation modes of FIGS. 3(B) and 3(D) are obtained by setting the signal φLHE and φLVE high during the write operation. The operation modes of FIGS. 3(A) and 3(C) are realized by holding the signal φLHE and φLVE low during the read operation. The capability to reverse the bit order during the serial-parallel or parallel-serial conversion and further to reverse the order in which to make read or write access to the memory array is basically essential for the LIFO operation. This capability is also necessary in realizing relatively easily the continuous LIFO operation for handling moving pictures. When the operation modes of FIGS. 3(A) and 3(B) are compared, it is seen that they are similar except that the directions in which to write into and read from the memory block 2 are opposite. Hence, if the next input data is written into the memory block 2 while the first input data that has been already written into the memory block 2 in the operation mode of FIG. 3(A) is being read successively, which writing mode corresponds to FIG. 3(B), this permits the writing of the next data in parallel with the reading of the first data during the process of the LIFO operation, thus realizing a continuous LIFO operation. Also in the operation modes shown in FIGS. 3(C) and 3(D), a similar continuous LIFO operation can be implemented.

LIFO Operation Timing: Example 1

Figure 7:
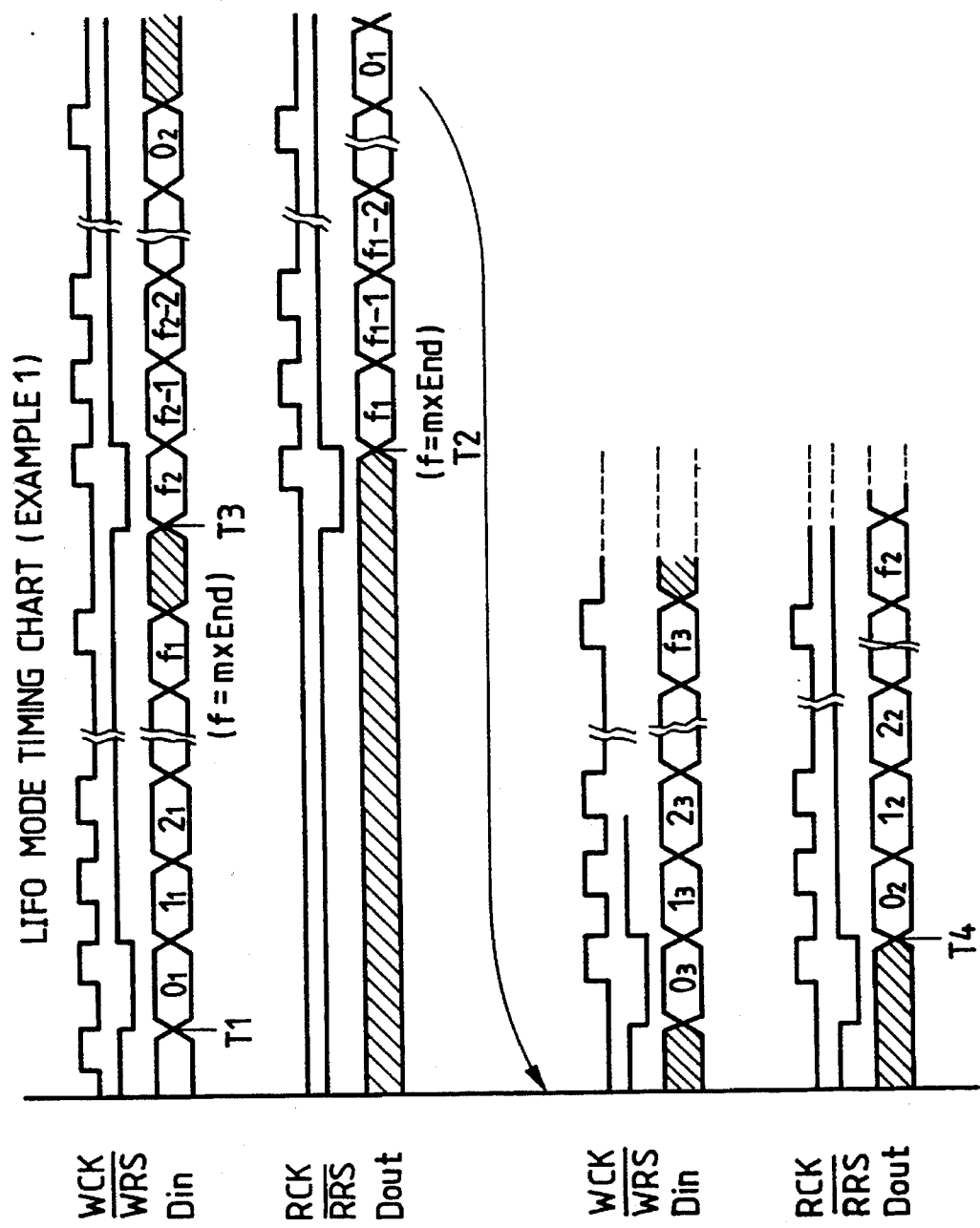
FIG. 7 is a timing chart of the LIFO operation.

FIG. 7 shows an exemplary operation timing chart showing the timing of operations during the LIFO mode of the serial memory according to this embodiment. The operation shown in the figure uses the entire memory address space in the memory block and realizes a continuous LIFO operation which allows the next data to be input while the preceding data is being output, thereby making it possible to deal with a moving picture. In FIG. 7, 0 to f are not addresses of the memory array, but are imaginary serial numbers for data. End shown in the figure refers to the number of addresses ranging from the start address of the memory array to the final address. In this embodiment, because the read and write operations for the memory array are performed parallelly m bits at a time, it is assumed that the relation of f=m×End holds. The operation shown in this timing chart uses the operation of FIGS. 3(A) and 3(B). This operation always maintains the serial-parallel conversion in the forward order and the parallel-serial conversion in the reverse order and alternately changes the direction of each access to the memory array to the forward and the reverse directions in synchronism with the switch timing from the completion of writing a group of data 0-f to the initiation of reading these data. This operation is explained below in detail.

First, the mode controller 21 according to an external control signal is set with an operation mode which holds the signal φLE12 high, φLE34 low and inverts the signals φLVE and φLHE, for example, at each write resetting. As a result, the serial memory performs as follows. The write address is reset in a cycle of the write clock WCK that occurs when the write reset signal WRS* is low or enabled. Data is successively input, starting with the data $0_1$ at time T1, in synchronism with the write clock WCK, and the write address is incremented every m bits until the final data $f_1$ is written into the last memory address. Next, to read out data in the reverse order to that in which it was written, the read reset signal RRS* is held low or enabled to reset the read address (i.e., the value of the read address latch). At this time, the signals φLHE and φLVE in FIG. 6 are both held high when the read operation is performed. This causes the horizontal address H-add and the vertical address V-add reset to "0" to be inverted and the end memory address of the memory array to be entered into the address decoders YDEC and XDEC. Further, since the signal φLE12 is set high, the data is output in synchronism with the read clock RCK in an order reverse to the input order, starting with the data $f_1$, the end data at the final memory address (time T2).

In practice, however, to start the output of the final data $f_1$ simultaneously with the read resetting, the data $f_1$ must be read out into the read buffer RB by the time the read reset is performed. In the FIFO operation, as for the start address of the memory array, when data is entered, it is stored either directly or through a memory cell into the read buffer (not shown) dedicated for the address "0" and, whenever a read resetting occurs, the data immediately starts to be output from the address-"0"-dedicated read buffer. In the LIFO operation, the address-"0"-dedicated read buffer is made to change the address from "0" to the final address in which to store data so that when the read resetting occurs, it is possible to immediately start outputting data from the final address. The control at this time needs to monitor the final address for the write operation. Monitoring the final address for the write operation uses an address directly generated by the address controller 20 before being inverted by the signals φLHE and φLVE. This is because the signals φLHE, φLVE are inverted at each write resetting to change the address to be supplied to the address decoder, as described later.

The read address is decremented every m bits until finally the data at the start address "0" of the memory cell is read out. The first data input/output operation performed so far corresponds to the operation mode of FIG. 3(A).

At the same time that the first data read operation is performed, a second data write operation is initiated from time T3. That is, the write reset signal WRS* is held low again, executing the write resetting on the write address register. At this time, FIG. 6 signals φLHE, φLVE are set high. As a result, like the read operation, the write address also is reset to the final address by the write resetting. The direction in which the serial input is serial-parallel converted remains the same as the first read operation. The data for the second write operation is given imaginary serial numbers $f_2$-$0_2$ as shown. The second group of data is serially input, beginning with the data $f_2$ located at the start of the second group, in synchronism with the write clock WCK. The write address is decremented every m bits until finally the data $0_2$ is entered into the start memory address "0."

Next, when the second data group is output from time T4, the signals φLHE, φLVE are set low at the read resetting. Thus, the memory access address is set with the start address "0" of the memory array and is incremented every m bits. Because the signal φLE12 remains high, the second group of data of 32 or less bits each is output in an order reverse to that in which it was input. In other words, the second data group is read out in synchronism with the read clock RCK, starting with the data $0_2$ at the head address "0" of the memory array and ending with the data $f_2$.

The second input/output operation corresponds to the operation mode of FIG. 3(B). According to this embodiment, as the signals φLHE, φLVE are inverted at each write resetting, the operation modes of FIGS. 3(A) and 3(B) are repeated to realize a continuous LIFO operation. The N-th data output and the (N+1)th data input are performed simultaneously in parallel. Because their address scan directions are the same, the read operation and the write operation do not contend with each other for access to the memory array as long as the input does not outpace the output in the cycle after the read resetting and write resetting. This control is carried out basically at the timing of the read clock and write clock as well as the reset timing.

LIFO Operation Timing: Example 2

Figure 8:
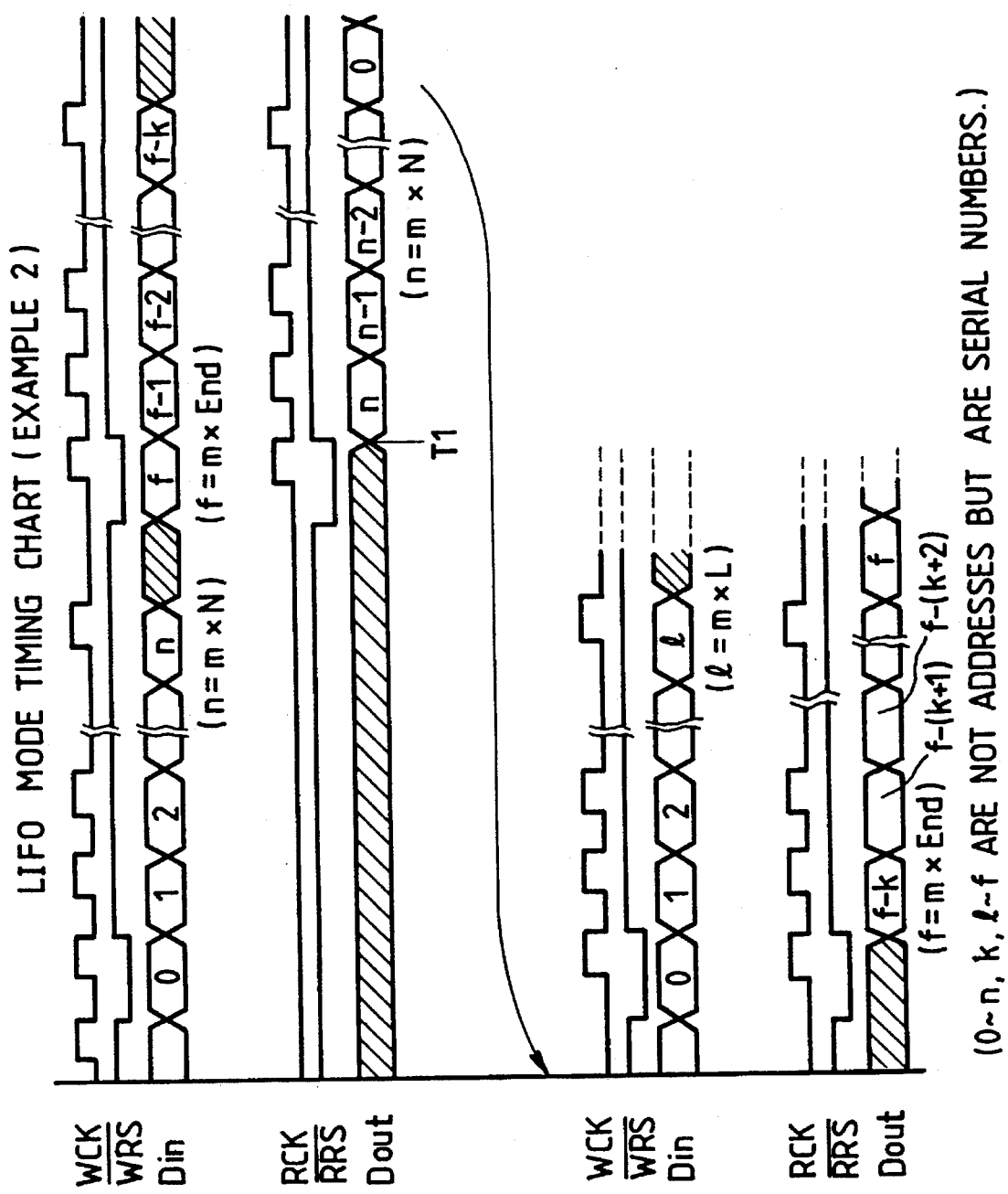
FIG. 8 is another timing chart of the LIFO operation.
Figure 9:
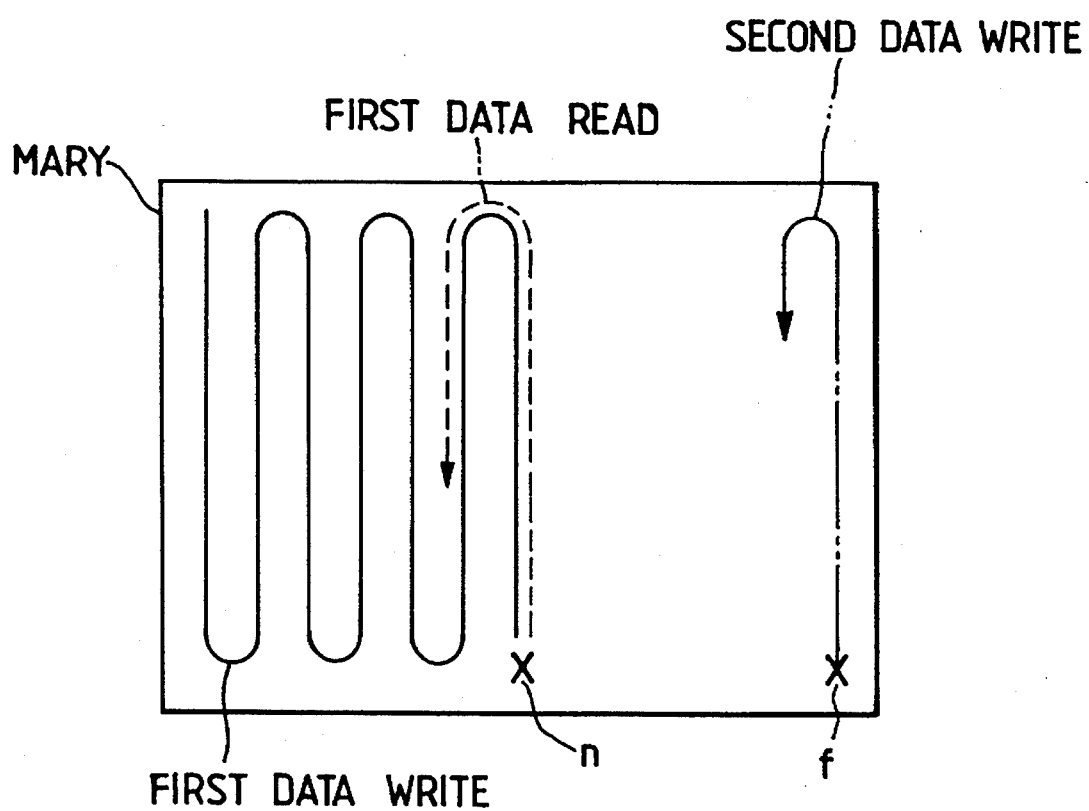
FIG. 9 is a conceptual diagram showing the state of use of the memory array in the LIFO operation.

FIG. 8 shows another timing chart for a continuous LIFO operation. This represents the case where a group of data to be processed under the LIFO operation is smaller in size than the entire space of the memory array. That is, the number of data in the group is n=m×N whereas the maximum number of data that can be accommodated is f=m×End (N<End). In the operation of FIG. 7, the access address which is reset at each read resetting and write resetting is virtually taken to be the start address or end address of the memory array. In this example, on the other hand, the final address N of the data taken in by the time of read resetting is taken to be the reset address at which to start reading. That is, the data output begins with the data n at the memory address N (time T1). In the actual circuit, because the signals φLVE, φLHE are inverted at the switch timing between the read and the write operations, the value of the write address latch at the switch timing is given to the read address latch. At each write resetting, the write address is reset to the start address and the end address of the memory array alternately. FIG. 9 conceptually shows how the memory array is used during the above operation. This permits a smooth execution of the continuous LIFO operation even when the second data group is larger in size than the first data group.

LIFO Operation Timing: Example 3

FIG. 10 shows the operation timing when a reverse scan is performed only in the horizontal direction. In the diagram, the write line increment signal WLI* and the read line increment signal RLI* request a memory access to be performed from the beginning of a line next to the line being accessed, starting from the write clock WCK cycle or read clock RCK cycle when these increment signals are set low. When the mode controller 21 is set with a horizontal direction input/output reverse scan mode, it operates to set the signal φLH12 high and keep the signal φLHE high at all times during the read operation.

At the write resetting, the data group starts to be taken in, beginning with the first data (0,0) from time T1, and the horizontal address H-add is incremented every m bits. When the final data (0,f) has been input to the line end memory address (0, Hmax) of the first line, the write line increment signal WLI* is held low to increment the write line to successively input the second line data from time T2.

The output operation can start one or more lines behind the input operation. At the read resetting, the value of the read address latch RdAL of the address controller 20 is reset to a value that specifies an access to the data at the first memory address (0,0). Because the signal φLHE is held high, the address decoder is given a memory address (0,Hmax), causing the read operations to be initiated in the reverse direction from the data (0,f) at the memory address (0,Hmax) (at time T3).

The memory controller has a dedicated read buffer designed to enable the output operation during normal mode to be started immediately when the read line increment signal RLI* is received. That is, when a new line starts to be output by the resetting or read line increment, the starting data of the next line can be read and stored in the buffer. During the horizontal direction input/output reverse scan mode, the address to be read into the dedicated read buffer (not shown) need only be switched from the line head address to the line end address. In practice, however, because the horizontal address generated by the address controller is inverted before being input to the address decoder, there is no need to modify the logic if the horizontal address H-add directly generated by the address controller 20 is monitored.

When the data output in synchronism with the read clock RCK has been done successively up to the data (0,0), the read line increment signal RLI* is held low to execute the read line increment, causing the address controller 20 to produce a memory address for accessing data (1,0). Because the signal φLEE is high, the horizontal address is reversed to an address (1,H max), causing the read operation to start from the line end address of the second line. That is, the memory access is performed in the reverse order, beginning with the data (1,f) at the memory address (1, Hmax). In this way, the read line increment is repeated until the final line is output, enabling the data, which was entered representing the two-dimensional picture, to be output inverted only in the horizontal direction.

Examples of System Application

Examples of system applications using the serial memory 1 of the above embodiment will be described below.

Figure 11A:
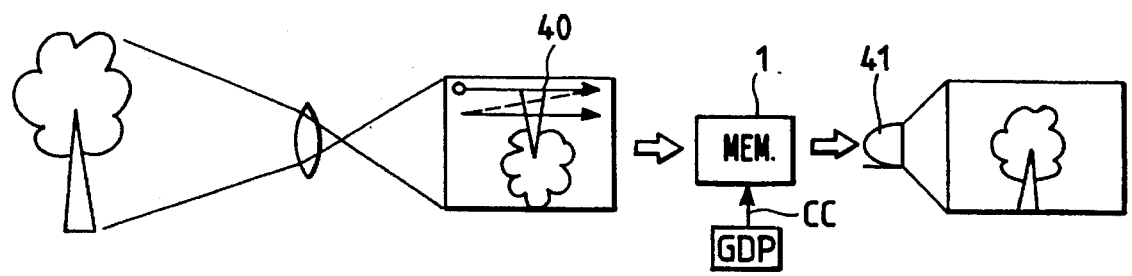
FIGS. 11(A) to 11(E) are explanatory views showing examples of system applications of the serial memory.

FIG. 11(A) shows an example of a system in which an image, optically inverted vertically and horizontally with respect to the object, is converted into a normal upright image by the serial memory 1 of this embodiment. Reference numeral 40 represents a data processing apparatus that scans the vertically and horizontally inverted image and successively feeds the scanned image data to the serial memory. Denoted by 41 is another data processing apparatus that performs a LIFO operation in the serial memory to read data and display a normal upright image based on the data. Because the serial memory of this embodiment can deal with a moving picture, as described above, it offers the same effect as is produced by the system that converts the image by an optical system using lenses. Therefore, with this serial memory, it is possible to reduce the number of lenses used in the system and therefore the overall size of the system.

Figure 11B:
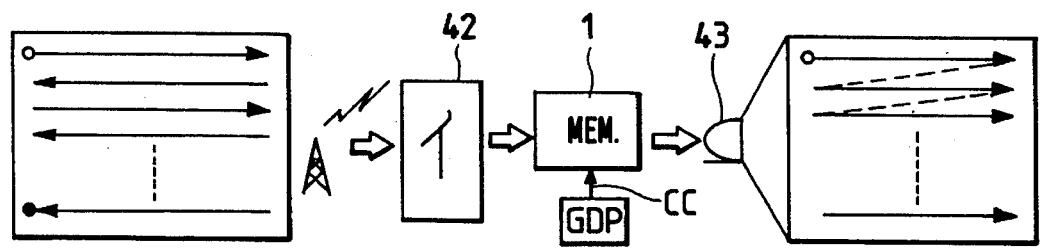

FIG. 11(B) shows an example of another application of this invention, in which a scanning method different from the common method for TV is used in the image data processing system, for example, in an image transmission system, in order to enhance the efficiency of data transmission. This scan method is a transmission technique that scans in the reverse direction during a period corresponding to the horizontal flyback time. In this case, to display the transmitted image on TV, it is necessary to change the order of scan. This can be accomplished by the serial memory of the above embodiment. In the figure, designated by 42 is a data processing means apparatus which performs a protocol control on data reception to write the received data into a serial memory. Reference number 43 is a data processing apparatus to reverse the direction of reading data from the serial memory.

Figure 11C:
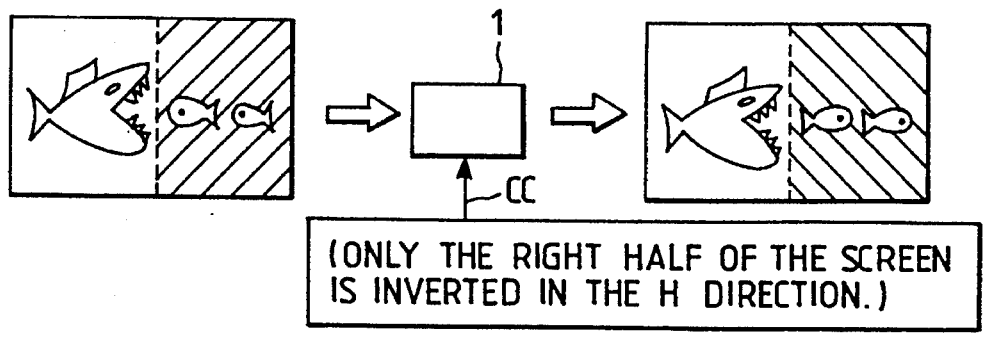

FIG. 11(C) shows one of the special reproducing functions applicable to a TV and VTR, whereby a part or the entire screen is mirror-inverted for display. This function can immediately be achieved by the serial memory of this embodiment. In the figure, denoted by 44 is a data processing apparatus GDP, which reverses only a right-hand half of the screen in the horizontal direction in reading the image data from the serial memory 1.

Figure 11D:
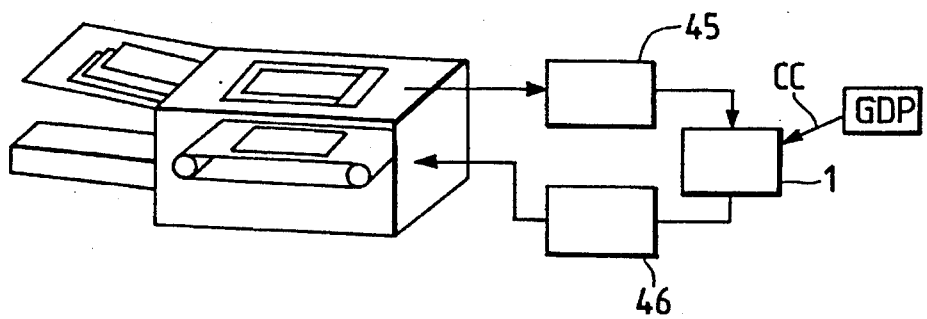

FIG. 11(D) shows an example of a case in which the above image inversion is applied. A copying machine reads data of an original by scanning through an optical system and sends the data serially to, for example, a printer for printout. Where the optical system to scan the original and the printing section to form an image on paper are provided facing the original and the printing sheet, respectively, when a copy is to be made on the front and back of the sheet, it is necessary to reverse the sheet in such a way as to keep the same relationship with the original as it is turned over. Such manipulation if performed either mechanically or manually is not easy at all. With the serial memory of this embodiment, it is possible to establish an arbitrary relation between the printing sheet and the original as they are turned from their front page to back page, by converting the data sent serially from the optical system 45 in a forward or reverse order only in the horizontal direction by the serial memory 1 and sending the converted data to the printer controller 46.

This in turn contributes to simplifying the mechanical construction including the reversing and transporting system for the copy sheet and original and the optical system.

Figure 11E:
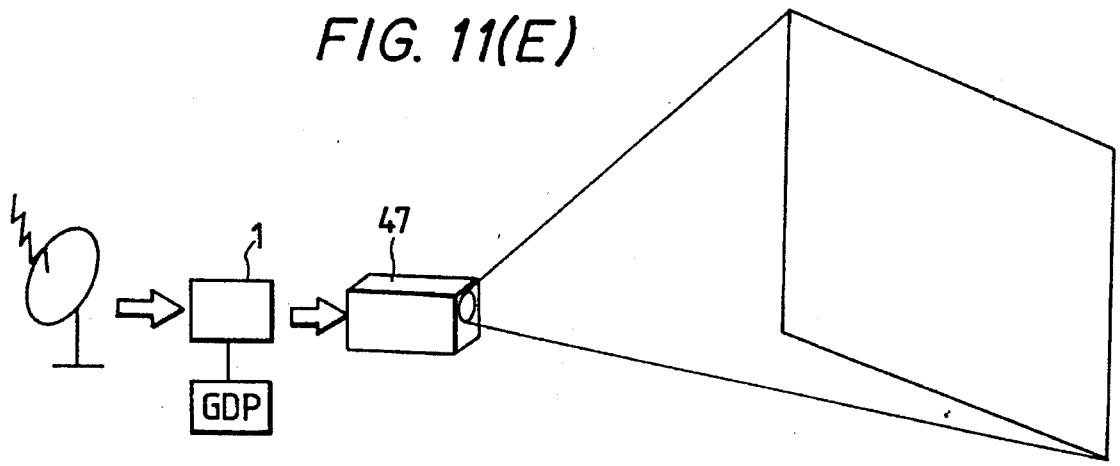

FIG. 11(E) shows another example of an application in which this invention is used in a projection type imaging system, such as a projection TV 47. Since the image projection reverses the image data, it is necessary to invert the image before projecting it. The serial memory 1 of this embodiment enables the image data to be inverted easily without requiring the processing by the optical system. In FIGS. 11(A) to 11(E), the graphic data processor GDP outputs a control signal CC, which corresponds to the control signal 12 in FIG. 1, to the serial memory 1 to control it.

The present invention has been described in conjunction with various representative embodiments and it should be noted that the invention is not limited to the above embodiments alone and that various modifications may be made without departing from the spirit of the invention. For example, the write counter and read counter may be formed by an up/down counter. The reversing of the memory access address may be performed at other than the write reset timing. For example, it may be carried out in synchronism with the read reset timing, considering the relation with the read timing. Further, the counting of the memory access address may be done by using an address latch and a decrementer.

Features and advantages provided by the representative aspects of this invention as disclosed in this specification may be briefly summarized as follows.

That is, in a serial memory which internally converts serial input data into parallel data and writes the data into a memory array two or more bits at a time, and which reads data two or more bits at a time from the memory array and internally converts the read data into serial data for output, a means is provided that allows selective reversing of the order of parallel conversion on the serial input data and of serial conversion on the parallel data read from the memory array. This serial memory is also provided with a means to reverse the ascending or descending order of the access address for the memory array in the read and write operations. This configuration permits a LIFO operation and a continuous LIFO operation.

This output reversion circuit means, which makes it possible to select the order of arrangement of the serial data and parallel data and also the ascending or descending order of the access address, offers the above-mentioned advantages without changing the fundamental configuration of the serial memory.

When the memory array has a two-dimensional address space defined by horizontal and vertical directions, it is possible to provide a serial memory compatible with a two-dimensional address which can reverse the input/output order only in the horizontal direction, by making the above-mentioned selection of order available in each of the two directions.

We claim:

1. A serial memory comprising:

a serial-parallel converter connected to receive serial input data;

a memory array into which converted parallel data, received from the serial-parallel converter, is written in a specified number of bits at a time;

a parallel-serial converter connected to receive data, which was read out a specified number of bits at a time from the memory array, and outputting converted serial data; and a memory control circuit for generating a sequence of access addresses for the memory array, and for controlling the writing and reading of data to and from locations in the memory array indicated by the access addresses, the memory control circuit including:

an address generator for controlling the sequence of generation of access addresses by selectively increasing or decreasing the access addresses according to an indication signal and for outputting the access addresses to said memory array in an increasing sequence or a decreasing sequence depending on said indication signal; and an operation mode controller for outputting said indication signal to said address generator for indicating to the address generator to increase or decrease the sequence of the access addresses to be outputted to said memory array.

2. The serial memory according to claim 1, further comprising:

a write counter for latching a specified number of bits, to be written into the memory array in a specified direction or in a reverse direction, into the serial-parallel converter.

3. The serial memory according to claim 1, further comprising:

a read count means for latching a specified number of bits, to be read out from the memory array in a specified direction or in a reverse direction, into the parallel-serial converter.

4. The serial memory according to claim 2, wherein the memory control circuit includes:

a write address latch connected to receive a write address and a read address latch connected to receive a read address; and an address setting circuit for operating, during reading of data which was written into the memory array using an access address sequence which is incremented or decremented, to set the write address latch and the read address latch to the end address and the start address of the memory array alternately when the order of reading is reversed with respect to the writing order by the operation mode controller.

5. The serial memory according to claim 4, wherein the memory array has a two-dimensional address space defined by horizontal and vertical directions, and a write address latch and a read address latch are provided for each of the two directions.

6. A serial memory system comprising:

a central processing unit; and a serial memory connected to the central processing unit, the serial memory comprising:

a serial-parallel converter connected to receive serial input data;

a memory array into which converted parallel data, received from the serial-parallel converter, is written a specified number of bits at a time;

a parallel-serial converter connected to receive data, which was read out a specified number of bits at a time from the memory array, and outputting converted serial data; and a memory control circuit for generating a sequence of access addresses for the memory array according to control signals from the central processing unit to control the writing and reading of data to and from locations in the memory array indicated by the access addresses, the memory control circuit including:

an address generator for controlling the sequence of generation of access addresses by selectively increasing or decreasing the access addresses according to an indication signal and for outputting the access addresses to said memory array in an increasing sequence or a decreasing sequence depending on said indication signal; and an operation mode control circuit for outputting said indication signal to said address generator for indicating to the address generator to output an increasing sequence or a decreasing sequence of the access addresses to be outputted to said memory array.

7. The serial memory system according to claim 6, further comprising:

a write counter for latching a specified number of bits, to be written into the memory array in a specified direction or in a reverse direction, into the serial-parallel converter.

8. The serial memory system according to claim 6, further comprising:

a read counter for latching a specified number of bits to be read out from the memory array in a specified direction or in a reverse direction, into the parallel-serial converter.

9. The serial memory system according to claim 7, further comprising:

a write address latch connected to receive a write address and a read address latch connected to receive a read address; and an address resetting circuit for operating, during reading of data which was written into the memory array using an access address sequence which is incremented or decremented, to set the write address latch and the read address latch to the end address and the start address of the memory array alternately when the order of reading is reversed with respect to the writing order by the operation mode control circuit.

10. The serial memory system according to claim 9, wherein the memory array has a two-dimensional address space defined by horizontal and vertical directions, and a write address latch and a read address latch are provided for each of the two directions.

* * * * *